United States Patent
Yoshizawa et al.

(10) Patent No.: US 7,206,112 B2
(45) Date of Patent: Apr. 17, 2007

(54) IMAGE DISPLAY DEVICE AND MANUFACURING METHOD

(75) Inventors: Atsushi Yoshizawa, Tsurugashima (JP); Takashi Chuman, Tsurugashima (JP); Takuya Hata, Tsurugashima (JP); Yoshihiko Uchida, Tsurugashima (JP); Hideo Satoh, Tsurugashima (JP); Shuuichi Yanagisawa, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/503,668

(22) PCT Filed: Sep. 19, 2003

(86) PCT No.: PCT/JP03/11993

§ 371 (c)(1),
(2), (4) Date: Aug. 6, 2004

(87) PCT Pub. No.: WO2004/032574

PCT Pub. Date: Apr. 15, 2004

(65) Prior Publication Data

US 2005/0151480 A1    Jul. 14, 2005

(30) Foreign Application Priority Data

Oct. 1, 2002    (JP)    ............... 2002-288695

(51) Int. Cl.
*G02F 1/03*    (2006.01)

(52) U.S. Cl. ............... 359/244; 359/242; 428/690

(58) Field of Classification Search ............... 359/244, 359/242, 238, 245, 247, 248; 428/690, 917, 428/212
See application file for complete search history.

(56) References Cited

U.S. PATENT DOCUMENTS

| 6,327,554 | B1 * | 12/2001 | Kobori | ............... 703/5 |
| 2003/0044639 | A1 * | 3/2003 | Fukuda | ............... 428/690 |

FOREIGN PATENT DOCUMENTS

| JP | 64-91076 | 4/1989 |
| JP | 4-291291 | 10/1992 |
| JP | 5-3081 | 1/1993 |
| JP | 7-261677 | 10/1995 |
| JP | 11-224783 | 8/1999 |
| JP | 2000-323277 | 11/2000 |
| JP | 2002-287668 | 10/2002 |

\* cited by examiner

*Primary Examiner*—Timothy Thompson
(74) *Attorney, Agent, or Firm*—Drinker Biddle & Reath LLP

(57) ABSTRACT

An image display device includes at least one transmissive display panel arranged at different depth positions in a direction normal to a display surface of the image display device. Each of the transmissive display panels includes a light-emitting layer that is sandwiched between a front side transmissive film and a rear side transmissive film. The rear side transmissive film has an interface with a maximum refractive index difference that causes an efficiency of light emitted from the light-emitting layer to become smaller than a front side light emission efficiency in the characteristics of light-emission efficiency, which changes with respect to a film thickness of the transmissive film due to optical interference.

15 Claims, 4 Drawing Sheets

IMAGE DISPLAY DEVICE AND MANUFACURING METHOD

TECHNICAL FIELD

The present invention relates to image display devices using a transmissive display panel including a light-emitting layer, and moreover to methods for manufacturing the same.

BACKGROUND ART

Electroluminescent (EL) display panels are known as one type of transmissive display panels including a light-emitting layer that is sandwiched between a front side transmissive film and a rear side transmissive film. The EL display panels use inorganic or organic thin films exhibiting electroluminescence (hereinafter also referred to as "EL") that emit light when injecting a current, and are provided with a light-emitting layer that is made of such an EL material.

One application of the transmissive display panel is a stereoscopic image display device. For example, provided that a transmissive display panel is positioned in the front of a display panel aligned with a certain distance, the same images are exhibited on these display panels respectively. When a viewer watches the back display panel through the transmissive display panel then he will see the same images as one merged image without recognizing two different images at different depth positions. Based on such a principle, there is a stereoscopic image display device in which the ratio of the brightness (luminance) of two identical images is changed partially so that the merged image is constructed as a stereoscopic image in the viewer's head.

Such a stereoscopic image display device puts little fatigue on the viewer, since it not only eliminates the need for any special 3D glasses, but also allows a more natural stereoscopic display than conventional stereoscopic image display devices.

Generally when a display panel displaying an image is viewed through a transmissive display panel that is aligned therewith at a certain distance in the depth direction, then reflections of the front side panel may occur. That is, the front side image may by reflected by the rear side panel and imaged again onto the front side panel, though the particular phenomenon is not limited to the stereoscopic image display device. As a result the viewed image may become fuzzy even in the stereoscopic image display device.

DISCLOSURE OF INVENTION

It is thus one of the objects of the present invention to provide an image display device that supplies sharp images to viewers, and in addition a method for manufacturing the same.

An image display device according to the present invention includes at least one transmissive display panel arranged at different depth positions in a direction normal to a display surface thereof, wherein the transmissive display panel includes a front side transmissive film and a rear side transmissive film, and a light-emitting layer sandwiched between the front side transmissive film and the rear side transmissive film. In the image display device, a lamination of the front side and rear side transmissive film and the light-emitting layer has a light-emission efficiency characteristics due to optical interference in which respective light-emission efficiencies of light emitted from the light-emitting layer varies as respective functions of film thicknesses of the front side and rear side transmissive films. In the image display device, the rear side transmissive film has an interface with a maximum refractive index difference so as to cause a light-emission of the rear side transmissive film smaller than a light-emission of the front side transmissive film.

Moreover, according to the present invention, a method for manufacturing a transmissive display panel including a front side transmissive film and a rear side transmissive film sandwiching a light-emitting layer formed on a transparent substrate. The method includes:

a first layering step of layering at least one rear side transmissive film including an interface with a maximum refractive index difference; and a second layering step of layering on the rear side transmissive film a light-emitting layer for emitting light with a wavelength $\lambda$ as a principal component;

wherein, in the first layering step, the rear side transmissive film is layered at such a film thickness that an optical distance from a light-emitting layer to the interface with the maximum refractive index difference is substantially equal to an odd integer multiple of one quarter of the wavelength $\lambda$.

DETAILED DESCRIPTION OF THE INVENTION

The following is a detailed description of an embodiment of an image display device in accordance with the present invention, with reference to the accompanying drawings.

Figure 1:
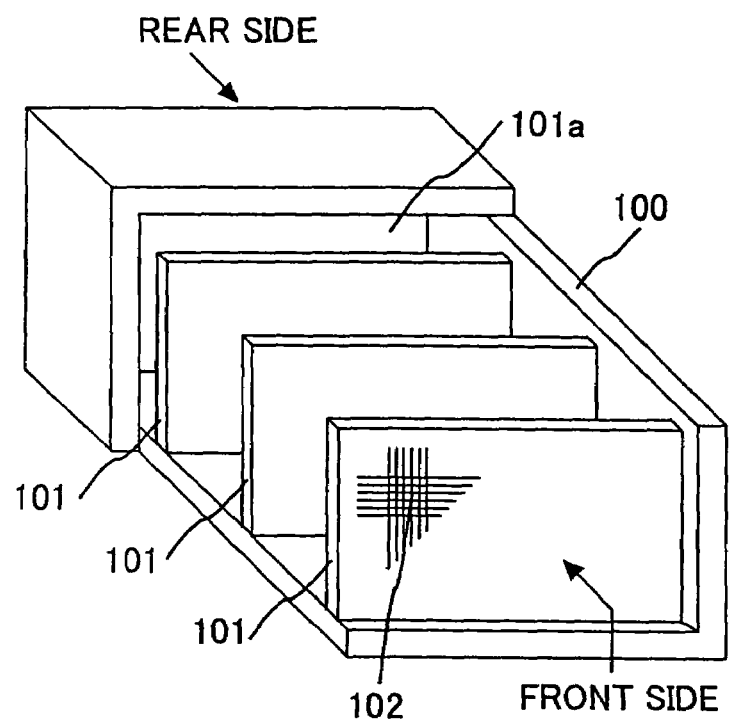
FIG. 1 is a diagrammatic cut-away perspective view showing an image display device according to an embodiment of the present invention.

FIG. 1 shows an image display device including three transmissive display panels 101 and one reflective display panel 101*a* that are accommodated in a casing 100 and are arranged at different depth positions from the rear to the front along a direction normal on the display surface. Other than the display panels 101, the display device also includes a power source and such electrical circuitry as an address driver, a data driver and a controller, which are not shown in the drawings.

The transmissive display panels 101 and the reflective display panel 101*a* are for example organic EL display devices made of a plurality of organic EL elements and are driven by passive-matrix driving.

The display panels 101 each include, on their display surface, "n" (n is an integer) scanning lines that are formed in parallel at a predetermined spacing, and "m" (m is an integer) data lines that are also formed in parallel at a predetermined spacing. The scanning lines and the data lines are separated by a predetermined spacing and arranged at right angles. The display panels 101 include n×m light-emitting portions 102 that are formed at the portions that correspond to the intersections between the scanning lines and the data lines. Moreover, the display panels 101 further include a power source line and a common line, which are connected to each of the light-emitting portions 102. One end of the scanning lines is connected to the address driver, and one end of the data lines is connected to the data driver.

The address driver applies a voltage sequentially to each of the scanning lines. The data driver applies to the data lines a data voltage for causing the light-emitting portions to emit light. The controller is connected to the address driver and the data driver, and controls the operation of the address driver and the data driver in accordance with image data that have been supplied to the controller in advance.

Figure 2:
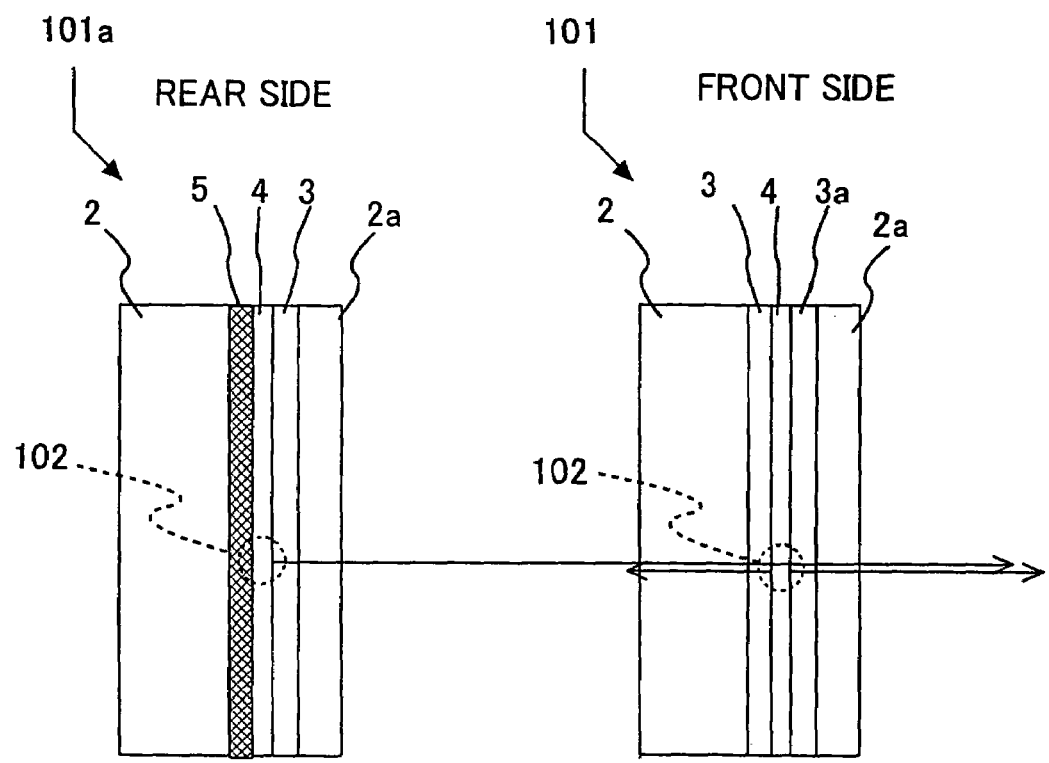
FIG. 2 is a diagrammatic partial sectional view showing a transmissive display panel and a reflective display panel in an image display device according to an embodiment of the present invention.

FIG. 2 shows an example with two display panels, namely a transmissive display panel 101 and a reflective display panel 101a. As shown in FIG. 2, if the transmissive display panel 101 is arranged at a distance in the depth direction from the reflective display panel 101a, then light emitted from the two panels can be observed from the front side. The light-emitting portions 102 of the organic EL elements in the reflective display panel 101a include a metal electrode 5, a plurality of organic compound material layers 4 including a light-emitting layer (the non-light-emitting portions are transmissive films), and a transparent electrode 3, layered in that order on a glass substrate 2, as shown in FIG. 2. The light-emitting portions 102 of organic EL elements in the transmissive display panel 101 include a transparent electrode 3, a plurality of organic compound material layers 4 including a light-emitting layer, and a second transparent electrode 3a, layered in that order on a glass substrate 2, as shown in FIG. 2. Both the reflective display panel 101a and the transmissive display panel 101 are protected by a transparent cover, such as a glass sheet 2a. Consequently, the light emitted from the light-emitting portions 102 of organic EL elements in the reflective display panel 101a travels toward the viewer on the front side, but a portion of the light emitted from the light-emitting portions 102 of organic EL elements in the transmissive display panel 101 travels toward the reflective display panel 101a on the rear side.

In this embodiment, the particular light (which is emitted from the light-emitting portions 102 of organic EL elements in the transmissive display panel 101 and travels toward the reflective display panel 101a on the rear side) is suppressed by optical interference due to the adjustment of the optical film thicknesses of the transmissive films in the organic compound material layers, for example. That is to say, the efficiency of the light emission from the light-emitting layer sandwiched between the front side and the rear side organic compound material layers in the transmissive display panel 101 is made smaller for the rear side than for the front side in the characteristics of the light-emission efficiencies which change with respect to the film thicknesses of the transmissive films due to the optical interference of the light reflected from an interface with a maximum refractive index provided at the rear or front side organic compound material layer, for example.

Figure 3:
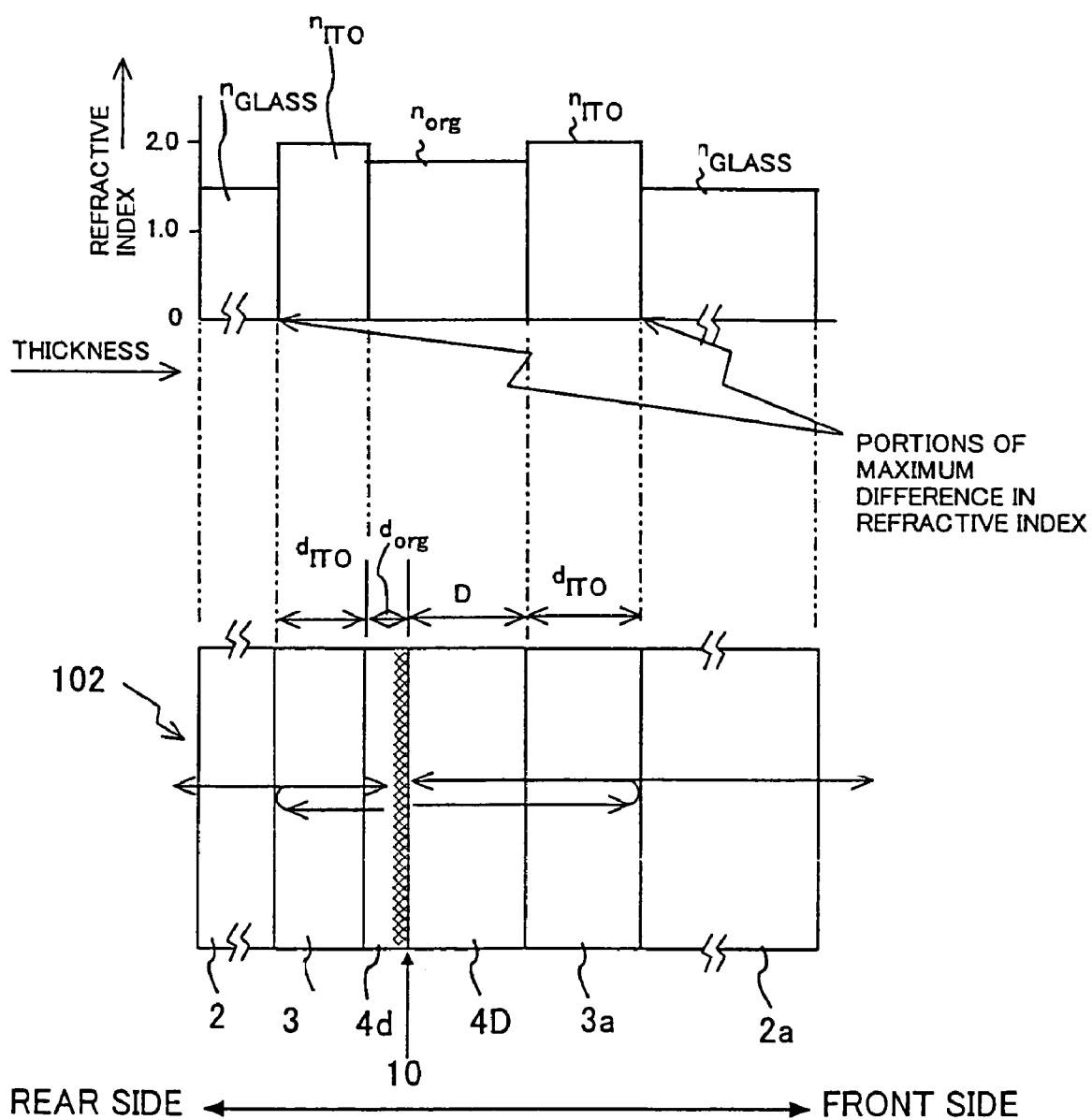
FIG. 3 is a sectional view showing an organic EL element of a transmissive display panel in an image display device according to an embodiment of the present invention.

The following is a more detailed discussion of the light paths and the light-emission efficiency of the light-emitting portions of the organic EL elements in the transmissive display panel 101. As shown in FIG. 3, the structure of the organic EL element 102 is such that a transparent electrode 3 made of ITO (indium tin oxide), a plurality of organic compound material layers 4 including a light-emitting layer, and a second transparent electrode 3a are layered in that order on a glass substrate 2. The organic compound material layers 4 are partitioned into a front side 4D and a rear side 4d with a light emission center 10 of the light-emitting layer as a boundary.

In the organic EL elements 102, the difference in refractive index i.e., refractive index difference at the interface between the glass substrate 2 and the transparent electrode 3 is much larger than the refractive index differences of the other adjacent layers, so that this interface with the maximum refractive index difference acts most strongly as a reflective interface. The refractive indices of materials used for fabrication of the organic EL element are as follows: the organic compound material layers 4d and 4D are about 1.8; the ITO transparent electrode 3 is about 2.0; and the glass (soda-lime glass) substrate 2 is about 1.5. Therefore, the difference of refractive index is 0.2 between the organic compound material layer 4d and the transparent electrode 3, and the refractive index difference is 0.5 between the glass substrate 2 and the transparent electrode 3, so that the difference of refractive index between the glass substrate 2 and the transparent electrode 3 is maximal in the rear side. Therefore, in the case that the light traveling from the light-emission center 10 of the light-emitting layer toward the transparent electrode 3 and coming back to the light-emission center 10, the small difference of refractive index between the organic compound material layer 4d and the transparent electrode 3 is neglected, but the maximum difference of refractive index between the glass substrate 2 and the transparent electrode 3 is taken into account. It should be noted that the interface with the maximum refractive index difference may be provided not only between the glass substrate and the transparent electrode, but also possible to form a film of a material with high refractive index inside the organic compound material layer 4d.

In the organic EL element 102 shown in FIG. 3, the main routes by which light generated at the light-emission center is released are the followings (1)–(3): (1) Radiation goes from the light-emission center directly toward the front side; (2) Radiation goes from the light-emission center toward the rear side, partial reflection back toward the light-emission center, through the light-emission center and toward the front side; and (3) Radiation is reflected at the glass back to the light-emission center and radiation by the same path. The influence on the light-emission efficiency is larger for route (2) than for route (1).

The settings of the optical film thickness of the organic compound material layer 4d on the rear side are as follows: the optical interference on the light emission route (2) is considered. As shown in FIG. 3, provided that "n" is the overall refractive index and "d" is the overall film thickness under the condition that light is reflected at the interface between the transparent electrode 3 and the substrate glass 2 and returns to the light-emission center, then an optical path length "2nd" is given by the total of the optical path length of the organic compound material layer and the optical path length of the transparent electrode as expressed by the following formula:

$$2nd = 2((n_{org}d_{org} + n_{ITO}d_{ITO})$$

Figure 4:
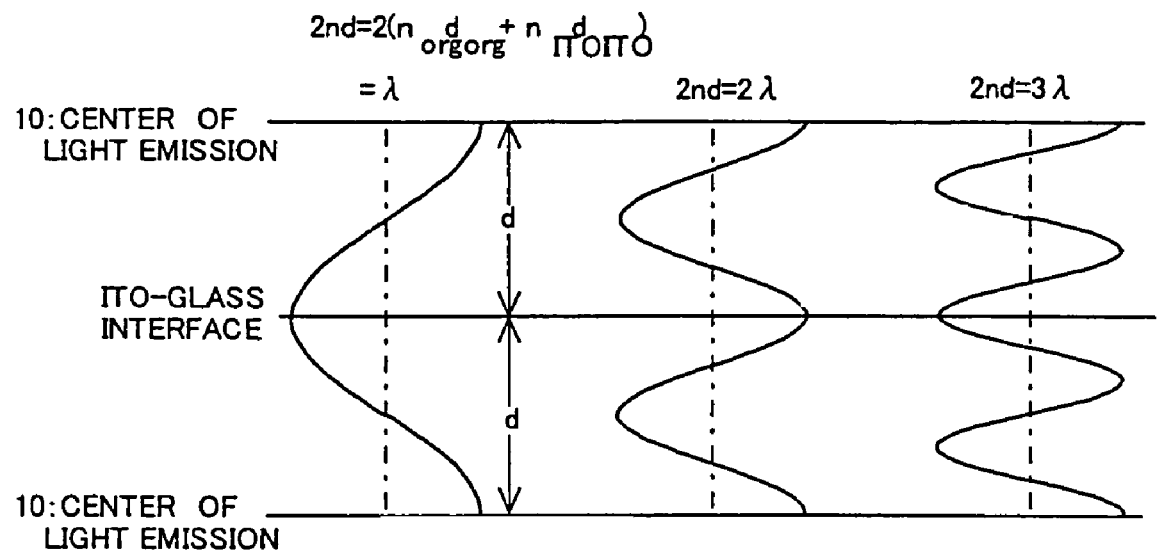
FIG. 4 is a diagram illustrating reflection in the organic compound material layer within an organic EL element of a transmissive display panel in an image display device according to an embodiment of the present invention.

(In this equation, $n_{org}$ denotes the refractive index of the organic compound material layer 4d, $d_{org}$ denotes the film thickness of the organic compound material layer 4d, $n_{ITO}$ denotes the refractive index of the transparent electrode 3, and $d_{ITO}$ denotes the film thickness of the transparent electrode 3.) Consequently, when the optical path length "2nd" of the light traveling back and forth is the same as an integer multiple of the wavelength λ, then the optical interference between the returning light and the emitted light becomes maximal. Thus, as shown in FIG. 4, the optical distance from the light-emission center where the optical interference becomes maximal to the interface with the maximum refractive index difference is given by the following formulae:

$$2(n_{org}d_{org}+n_{ITO}d_{ITO})=j\lambda$$

$$\therefore (n_{org}d_{org}+n_{ITO}d_{ITO})=2j(\lambda/4)$$

(In this equation, "j" denotes an integer of 1 or more.) If the total film thickness of the organic compound material layer 4d and the transparent electrode 3 is set to the vicinity of one value of this calculated optical distances, then the optical intensity of the unnecessary light returning to the rear side due to optical interference becomes large. That is to say, the film thickness on the rear side of the organic compound material layer 4d at which the optical interference effect becomes maximal should be set such that the optical distance ($n_{org}d_{org}+n_{ITO}d_{ITO}$) from the light-emitting center 10 to the interface with the maximum refractive index difference becomes substantially equal to an odd integer multiple of one quarter of the wavelength λ, rather than such that it becomes substantially equal to an even integer multiple of one quarter of the wavelength λ. Accordingly, the light traveling from the light-emitting portions 102 toward the reflective display panel 101a on the rear side can be suppressed through the optical interference in such a manner that an interface with a maximum refractive index difference is provided in the rear side, for example, within the organic compound material film, while adjusting the optical film thickness of the organic compound material layer, so that a light-emission efficiency on the rear side is smaller than that of on the front side in the characteristics of the light-emission efficiency that changes with respect to the film thickness of the organic compound material layer due to optical interference with the light reflected from that interface.

In the process for manufacturing the organic EL elements as a first forming step of forming an organic compound material layer, the organic compound material layer on the rear side is formed on a transparent electrode formed on a transparent substrate by depositing one or more of the organic compound material layers other than the light-emitting layer that is supposed to emit mainly light with an wavelength λ at such a film thickness that the optical distance from the light-emitting center of the light-emitting layer to the interface with the maximum refractive index difference becomes substantially equal to an odd multiple of one quarter of the wavelength λ. Then, as a second forming step of forming the organic compound material layer, the light-emitting layer and the remaining organic compound material layers on the front side are layered on the rear side organic compound material layer at a film thickness that is substantially equal to an even integer multiple of one quarter of the wavelength λ, and then a second transparent electrode 3a is formed on top of that.

Since the optical interference structure of the EL elements in which a light-emitting layer is sandwiched between the front side and rear side organic compound material layers in the transmissive display panel 101, as the film thickness of the organic compound material layer is gradually increased, the film thickness wherein the phases in the above described light-traveling routes agree with each other appears one after another. In particular, as the film thickness is increased, the element demonstrates the maximum and minimum values in the light emission efficiency characteristics with respect to the film thickness of the transparent electrode side portion of the organic compound material layer. In other words, the light emission efficiency characteristics depend on the total film thickness of the organic compound material layers of the transparent electrode side.

Figure 5:
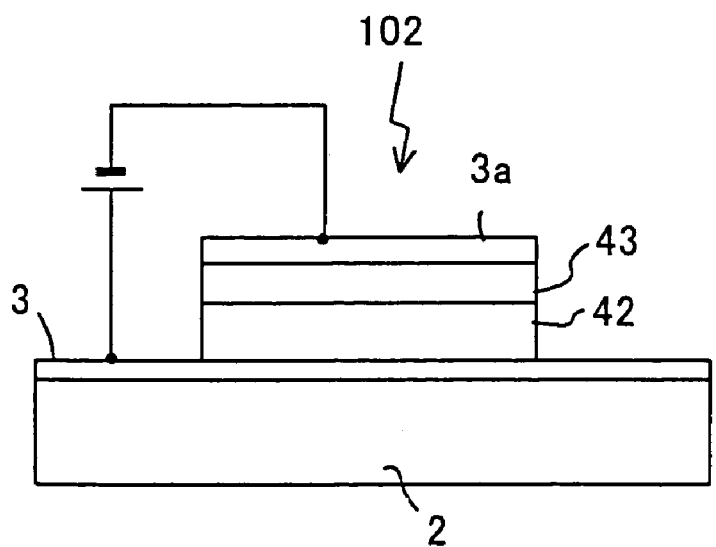
FIG. 5 is a sectional view of an organic EL element made for experimental purposes.

For example, as shown in FIG. 5, a plurality of organic EL elements were fabricated in which a transparent electrode (anode) 3/ a hole transport layer 42/ a light-emitting layer 43/ a transparent electrode (cathode) 5 are deposited in that order on a substrate 2 respectively using for these materials (and film thicknesses), ITO (100 nm or 175 nm)/TPD e.g., diphenyl-N,N'-bis(3-methlphenyl)-1,1'-diphenyl-4,4'diamine (40 to 200 nm)/aluminum oxine chelate i.e., tris(8-hydroxyquinoline) aluminum Alq3 (60 nm)/ITO with added Li. Respective elements having hole transport layers different in thickness as such was subjected to the measurement of the external quantum efficiency of the organic EL element. In this case, the vicinity of the interface of the light-emitting layer 43 on the side of the hole transport layer 42 is the light-emission center.

Figure 6:
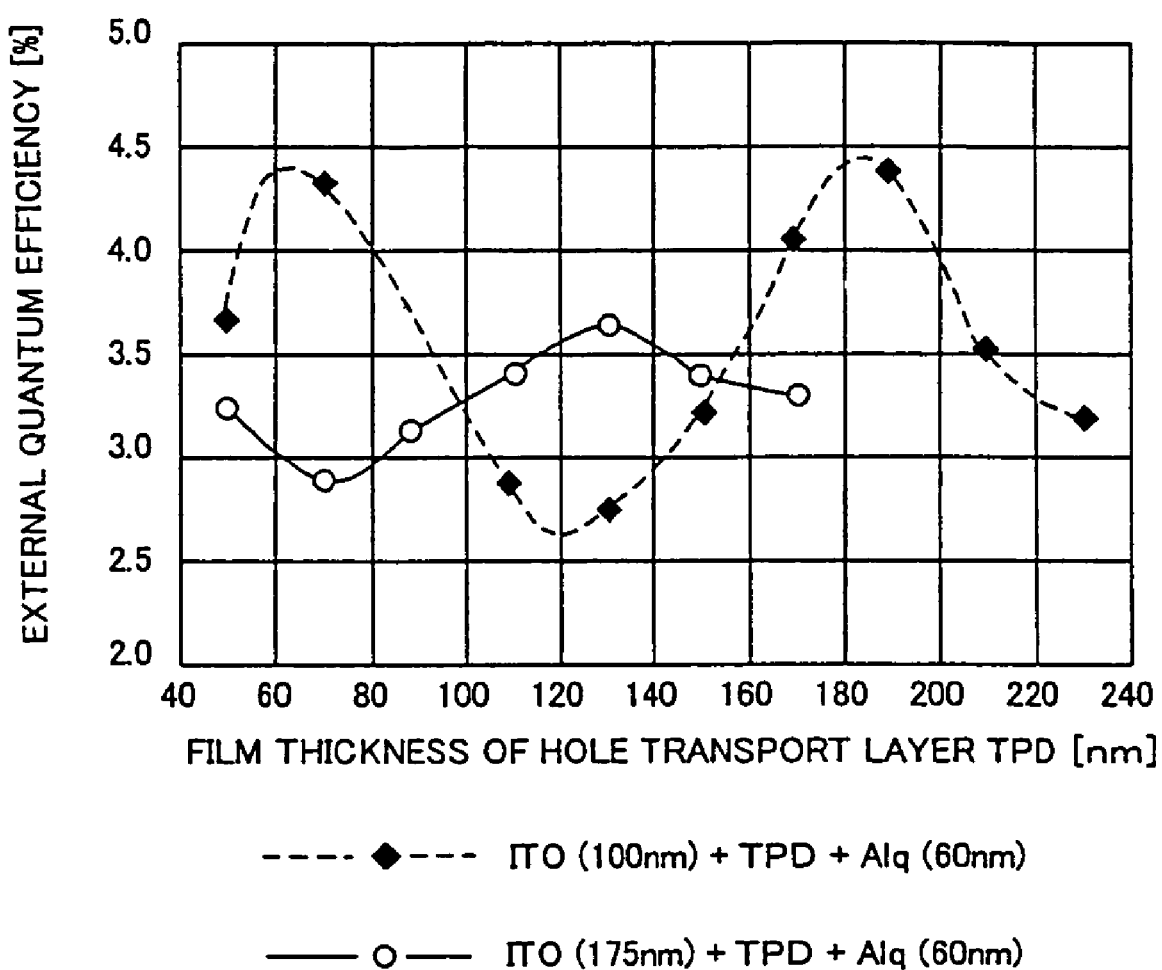
FIG. 6 is a graph showing the characteristics of the external quantum efficiency in relation to the thickness of the hole transport layer in the organic EL element according to the present invention.

FIG. 6 shows the relationship between the thickness of the hole transport layer film, which is a portion of the organic compound material layers, and the externally retrieved quantum efficiency of the organic EL elements. When taking the film thickness of the hole transport layer as the horizontal axis and taking the external quantum efficiency as the vertical axis, then the efficiency of the organic EL element increases and decreases periodically as shown in FIG. 6 with respect to a transparent electrode of the same thickness (100 nm or 175 nm). In FIG. 6, characteristics for two types of transparent electrodes 100 nm and 175 nm in thickness are plotted with the curves of a dotted line and a solid line, respectively. As for the relationship between both curves, the curves have the same period of an increase and decrease but their phases are shifted by about half a period each other. This is because the difference in film thickness (75 nm) between the two types of transparent electrodes is optically an odd integer multiple of the half of the peak wavelength (520 nm) of the EL spectrum, so that enhancement and cancellation due to the optical interference are anti-phase. Furthermore, the amplitude difference of the two curves also seems to be affected by reflections at the interface between the transparent electrode and the organic compound material layer when the refractive index difference at that interface is large.

It should be noted that the foregoing embodiment has been described only for a monochromatic wavelength. However, as another embodiment, it is possible to devise a display device with multi-color light emission wherein, light-emitting layers made of different organic compound materials for EL that emit the colors blue, green and red when a current is applied to them are independently and individually layered at the pixels of the corresponding matrix positions. With such an embodiment, a matrix-driven display device with a plurality of pixels is attained, in which each pixel is given by one set of blue, green and red light-emitting organic EL elements.

More specifically, a transmissive display panel was fabricated that was made of organic EL elements each having a two-layer structure in which receptive rear side hole transport layers with certain refractive indices (n=1.85, n=1.75, n=1.72) were provided on ITO electrodes with certain refractive indices (n=1.525, n=1.520, n=1.515), which were provided on glass substrates with certain refractive indices (n=1.525, n=1.520, n=1.515), and light-emitting layers made of organic compound materials for displaying EL of blue (λ=450 nm), green (λ=530 nm) and red (λ=620 nm) were formed on the rear side hole transport layers respectively. In this case, those refractive indices were values corresponding to the respective wavelengths of EL colors, and the film thicknesses of the rear side hole transport layers were set to 60.8 nm, 75.7 nm and 90.1 nm.

It should be noted that the above embodiments were described for organic EL elements utilizing thin films of organic EL materials, but it is also possible to devise an image display device made of a transmissive display panel made of inorganic EL elements utilizing thin films of inorganic EL materials.

The invention claimed is:

1. An image display device comprising:
at least one transmissive display panel arranged at different depth positions in a direction normal to a display surface thereof,
wherein each transmissive display panel includes
a pair of a front side transparent electrode and a rear side transparent electrode;
a front side transmissive film and a rear side transmissive film sandwiched between the front side transparent electrode and the rear side transparent electrode, and
a light-emitting layer sandwiched between the front side transmissive film and the rear side transmissive film,
wherein a lamination of the front side and rear side transmissive film and the light-emitting layer has a light-emission efficiency characteristics due to optical interference in which respective light-emission efficiencies of light emitted from the light-emitting layer varies as respective functions of film thicknesses of the front side and rear side transmissive films, and
wherein the rear side transmissive film has an interface with a maximum refractive index difference so as to cause a light-emission of the rear side transmissive film smaller than a light-emission of the front side transmissive film.

2. The image display device according to claim 1, wherein the position of the interface with the maximum refractive index difference in the rear side transmissive film is a position of an optical distance from the light-emitting layer that causes a minimum value between adjacent maximum values of the light-emission efficiency in said light-emission efficiency characteristics.

3. The image display device according to claim 2, wherein the light-emitting layer is made of a material that emits light of the wavelength λ as a principal component, wherein the optical distance from the light-emitting layer to the interface with the maximum refractive index difference in the rear side transmissive film is substantially equal to an odd integer multiple of one quarter of the wavelength λ.

4. The image display device according to any one of claims 1–3, wherein the light-emitting layer is made of an organic compound exhibiting electroluminescence, at least one of the front side and rear side transmissive films includes an organic compound material layer that supplies holes or electrons to the light-emitting layer, and wherein the image display device further includes a pair of transparent electrodes sandwiching the light-emitting layer and the organic compound material layer therebetween.

5. The image display device according to claim 4, wherein the transparent electrodes define a front side with a maximum refractive index difference and the rear side interface with the maximum refractive index difference respectively.

6. The image display device according to claim 5, wherein a plurality of the light-emitting layers are arranged in an array, the plurality of light-emitting layers are made of organic compounds exhibiting different electroluminescence, and the interfaces with the maximum refractive index difference are disposed in correspondence to colors of the emitted light respectively.

7. A method for manufacturing a transmissive display panel including a rear side transmissive film and a front side transmissive film sandwiching a light-emitting layer, formed on a transparent substrate, the method comprising:
a first layering step of layering at least one rear side transmissive film including an interface with a maximum refractive index difference on a rear side transparent electrode; and
a second layering step of layering on the rear side transmissive film a light-emitting layer for emitting light with a wavelength λ as a principal component and a front side transparent electrode;
wherein, in the first layering step, the rear side transmissive film is layered at such a film thickness that an optical distance from a light-emitting layer to the interface with the maximum refractive index difference is equal to an odd integer multiple of one quarter of the wavelength λ.

8. The manufacturing method according to claim 7, further comprising:
a third layering step of layering on the light-emitting layer a front side transmissive film with a thickness that is substantially equal to an even integer multiple of one quarter of the wavelength λ;
wherein a lamination of the front side and rear side transmissive film and the light-emitting layer has a light-emission efficiency characteristics due to optical interference in which respective light-emission efficiencies of light emitted from the light-emitting layer varies as respective functions of film thicknesses of the front side and rear side transmissive films, and
wherein the rear side transmissive film has an interface with a maximum refractive index difference so as to cause a light-emission of the rear side transmissive film smaller than a light-emission of the front side transmissive film.

9. The manufacturing method according to claim 7 or 8, wherein the light-emitting layer is made of an organic compound exhibiting electroluminescence, at least one of the front side and rear side transmissive films includes an organic compound material layer that supplies holes or electrons to the light-emitting layer, and wherein the image display device further includes a pair of transparent electrodes sandwiching the light-emitting layer and the organic compound material layer therebetween.

10. A transmissive display panel comprising:
a pair of a front side transparent electrode and a rear side transparent electrode;
a front side transmissive film and a rear side transmissive film sandwiched between the front side transparent electrode and the rear side transparent electrode, and
a light-emitting layer sandwiched between the front side transmissive film and the rear side transmissive film,
wherein a lamination of the front side and rear side transmissive film and the light-emitting layer has a light-emission efficiency characteristics due to optical interference in which respective light-emission efficiencies of light emitted from the light-emitting layer varies as respective functions of film thicknesses of the front side and rear side transmissive films, and wherein the rear side transmissive film has an interface with a maximum refractive index difference so as to cause a light-emission of the rear side transmissive film smaller than a light-emission of the front side transmissive film.

11. A transmissive display panel according to claim 10, wherein the position of the interface with the maximum refractive index difference in the rear side transmissive film is a position of an optical distance from the light-emitting layer that causes a minimum value between adjacent maximum values of the light-emission efficiency in said light-emission efficiency characteristics.

12. A transmissive display panel according to claim 11, wherein the light-emitting layer is made of a material that emits light of the wavelength $\lambda$ as a principal component, wherein the optical distance from the light-emitting layer to the interface with the maximum refractive index difference in the rear side transmissive film is substantially equal to an odd integer multiple of one quarter of the wavelength $\lambda$.

13. A transmissive display panel according to any one of claims 10–12, wherein the light-emitting layer is made of an organic compound exhibiting electroluminescence, at least one of the front side and rear side transmissive films includes an organic compound material layer that supplies holes or electrons to the light-emitting layer, and wherein the transmissive display panel further includes a pair of transparent electrodes sandwiching the light-emitting layer and the organic compound material layer therebetween.

14. A transmissive display panel according to claim 13, wherein the transparent electrodes define a front side with a maximum refractive index difference and the rear side interface with the maximum refractive index difference respectively.

15. A transmissive display panel according to claim 14, wherein a plurality of the light-emitting layers are arranged in an array, the plurality of light-emitting layers are made of organic compounds exhibiting different electroluminescence, and the interfaces with the maximum refractive index difference are disposed in correspondence to colors of the emitted light respectively.

* * * * *